United States Patent
Yang

(10) Patent No.: US 11,809,713 B1
(45) Date of Patent: Nov. 7, 2023

(54) METHOD AND APPARATUS FOR PERFORMING DATA ACCESS MANAGEMENT OF MEMORY DEVICE WITH AID OF RANDOMNESS-PROPERTY CONTROL

(71) Applicant: Silicon Motion, Inc., Hsinchu County (TW)

(72) Inventor: Tsung-Chieh Yang, Hsinchu (TW)

(73) Assignee: Silicon Motion, Inc., Hsinchu County (TW)

( * ) Notice: Subject to any disclaimer, the term of this patent is extended or adjusted under 35 U.S.C. 154(b) by 0 days.

(21) Appl. No.: 17/863,383

(22) Filed: Jul. 12, 2022

(51) Int. Cl.
*G06F 3/06* (2006.01)
*G06F 12/02* (2006.01)

(52) U.S. Cl.
CPC ............ *G06F 3/0611* (2013.01); *G06F 3/064* (2013.01); *G06F 3/0679* (2013.01); *G06F 12/0253* (2013.01); *G06F 2212/7205* (2013.01)

(58) Field of Classification Search
CPC .................................................. G06F 3/0611
See application file for complete search history.

(56) References Cited

U.S. PATENT DOCUMENTS

| | | | |
|---|---|---|---|
| 2014/0310534 A1* | 10/2014 | Gurgi | G06F 12/0246 713/193 |
| 2014/0344216 A1* | 11/2014 | Abercrombie | G06F 16/137 707/609 |
| 2019/0146705 A1* | 5/2019 | Lin | G06F 3/0659 711/103 |

* cited by examiner

*Primary Examiner* — Khoa D Doan
*Assistant Examiner* — Marwan Ayash
(74) *Attorney, Agent, or Firm* — Winston Hsu

(57) ABSTRACT

A method for performing data access management of a memory device with aid of randomness-property control and associated apparatus are provided. The method may include: receiving a plurality of host commands from a host device and performing data access on the NV memory according to the plurality of host commands, for example, in response to at least one host write command, programming data into at least one single level cell (SLC) block to be first stored data corresponding to a data reception stage; and performing a seed-aware garbage collection (GC) procedure to collect valid data among the first stored data of the at least one SLC block into at least one non-SLC block to be second stored data corresponding to a data storage stage, for example, performing a randomness-property checking operation on multiple seeds to selectively determine respective data of multiple pages within the SLC block as target data.

13 Claims, 7 Drawing Sheets

METHOD AND APPARATUS FOR PERFORMING DATA ACCESS MANAGEMENT OF MEMORY DEVICE WITH AID OF RANDOMNESS-PROPERTY CONTROL

BACKGROUND OF THE INVENTION

1. Field of the Invention

The present invention is related to memory control, and more particularly, to a method and apparatus for performing data access management of a memory device with aid of randomness-property control.

2. Description of the Prior Art

A memory device may comprise a Flash memory for storing data, and the management of accessing the Flash memory is complicated. For example, the memory device may be a memory card, a solid state drive (SSD), or an embedded storage device such as that conforming to Universal Flash Storage (UFS) specification. When a manufacturer tries to implement some features of the memory device according to existing specification, some problems may occur. More particularly, the memory device may spend too much time on performing some internal operations of the memory device in response to host-side write requests, causing the overall performance to be reduced. In addition, the memory device may be equipped with a dynamic random access memory (DRAM), and a controller integrated circuit (IC) within the memory device may use the DRAM to perform the internal operations of the memory device, and/or to buffer write data from a host device during a write procedure. For example, the controller IC may frequently access the DRAM to perform the internal operations of the memory device and occupy the transmission bandwidth of the DRAM, so the transmission bandwidth of the DRAM may be insufficient for direct memory access (DMA) operations performed by the host device during the write procedure, causing the overall performance to be reduced. The related art tries to correct these problems, but further problems such as some side effects may be introduced. Thus, a novel method and associated architecture are needed for solving the problems without introducing any side effect or in a way that is less likely to introduce a side effect.

SUMMARY OF THE INVENTION

It is therefore an objective of the present invention to provide a method and apparatus for performing data access management of a memory device with aid of randomness-property control, in order to solve the above-mentioned problems.

At least one embodiment of the present invention provides a method for performing data access management of a memory device with aid of randomness-property control, where the method can be applied to a memory controller of the memory device. The memory device may comprise the memory controller and a non-volatile (NV) memory, and the NV memory may comprise at least one NV memory element (e.g., one or more NV memory elements). The method may comprise: receiving a plurality of host commands from a host device and performing data access on the NV memory according to the plurality of host commands, wherein performing the data access on the NV memory according to the plurality of host commands comprises: in response to at least one host write command among the plurality of host commands, programming data into at least one single level cell (SLC) block to be first stored data corresponding to a data reception stage. The method may further comprise: performing a seed-aware garbage collection (GC) procedure to collect valid data among the first stored data of the at least one SLC block into at least one non-SLC block to be second stored data corresponding to a data storage stage, wherein a bit count per memory cell for a plurality of memory cells within the at least one non-SLC block is greater than one, and the seed-aware GC procedure comprises: performing a first randomness-property checking operation on a first seed and a second seed to generate a first randomness-property checking result; and according to the first randomness-property checking result, selectively determining first data of a first page within the at least one SLC block and second data of a second page within the at least one SLC block as a first set of target data for being programmed into the at least one non-SLC block with at least one internal copy operation of the NV memory, wherein the first data is randomized with the first seed before the first data is programmed into the first page in the data reception stage, and the second data is randomized with the second seed before the second data is programmed into the second page in the data reception stage.

In addition to the above method, the present invention also provides a memory device, and the memory device comprises a NV memory and a memory controller. The NV memory is arranged to store information, wherein the NV memory may comprise at least one NV memory element (e.g. one or more NV memory elements). The memory controller is coupled to the NV memory, and the memory controller is arranged to control operations of the memory device. In addition, the memory controller comprises a processing circuit that is arranged to control the memory controller according to a plurality of host commands from a host device, to allow the host device to access the NV memory through the memory controller. For example, the memory controller receives the plurality of host commands from the host device and performs data access on the NV memory according to the plurality of host commands, wherein performing the data access on the NV memory according to the plurality of host commands comprises: in response to at least one host write command among the plurality of host commands, programming data into at least one single level cell (SLC) block to be first stored data corresponding to a data reception stage. In addition, the memory controller performs a seed-aware garbage collection (GC) procedure to collect valid data among the first stored data of the at least one SLC block into at least one non-SLC block to be second stored data corresponding to a data storage stage, wherein a bit count per memory cell for a plurality of memory cells within the at least one non-SLC block is greater than one, and the seed-aware GC procedure comprises: performing a first randomness-property checking operation on a first seed and a second seed to generate a first randomness-property checking result; and according to the first randomness-property checking result, selectively determining first data of a first page within the at least one SLC block and second data of a second page within the at least one SLC block as a first set of target data for being programmed into the at least one non-SLC block with at least one internal copy operation of the NV memory, wherein the first data is randomized with the first seed before the first data is programmed into the first page in the data reception stage, and the second data is randomized with the second seed before the second data is programmed into the second page in the data reception stage.

According to some embodiments, an associated electronic device is also provided. The electronic device may comprise the above memory device, and may further comprise: the host device, coupled to the memory device. The host device may comprise: at least one processor, arranged for controlling operations of the host device; and a power supply circuit, coupled to the at least one processor, arranged for providing power to the at least one processor and the memory device. In addition, the memory device may provide the host device with storage space.

In addition to the above method, the present invention also provides a memory controller of a memory device, where the memory device comprises the memory controller and a NV memory. The NV memory may comprise at least one NV memory element (e.g. one or more NV memory elements). In addition, the memory controller comprises a processing circuit that is arranged to control the memory controller according to a plurality of host commands from a host device, to allow the host device to access the NV memory through the memory controller. For example, the memory controller receives the plurality of host commands from the host device and performs data access on the NV memory according to the plurality of host commands, wherein performing the data access on the NV memory according to the plurality of host commands comprises: in response to at least one host write command among the plurality of host commands, programming data into at least one single level cell (SLC) block to be first stored data corresponding to a data reception stage. In addition, the memory controller performs a seed-aware garbage collection (GC) procedure to collect valid data among the first stored data of the at least one SLC block into at least one non-SLC block to be second stored data corresponding to a data storage stage, wherein a bit count per memory cell for a plurality of memory cells within the at least one non-SLC block is greater than one, and the seed-aware GC procedure comprises: performing a first randomness-property checking operation on a first seed and a second seed to generate a first randomness-property checking result; and according to the first randomness-property checking result, selectively determining first data of a first page within the at least one SLC block and second data of a second page within the at least one SLC block as a first set of target data for being programmed into the at least one non-SLC block with at least one internal copy operation of the NV memory, wherein the first data is randomized with the first seed before the first data is programmed into the first page in the data reception stage, and the second data is randomized with the second seed before the second data is programmed into the second page in the data reception stage.

The present invention method and apparatus can guarantee that the memory device can operate properly in various situations, and more particularly, prevent spending too much time on performing some internal operations of the memory device in response to host-side write requests. For example, in a situation where the write data amount during a write procedure is very great, the host device may intermittently overwrites some data, and the memory device can still operate properly without being hindered by the overwrite behavior of the host device. In addition, the present invention method and apparatus can solve the related art problems without introducing any side effect or in a way that is less likely to introduce a side effect.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
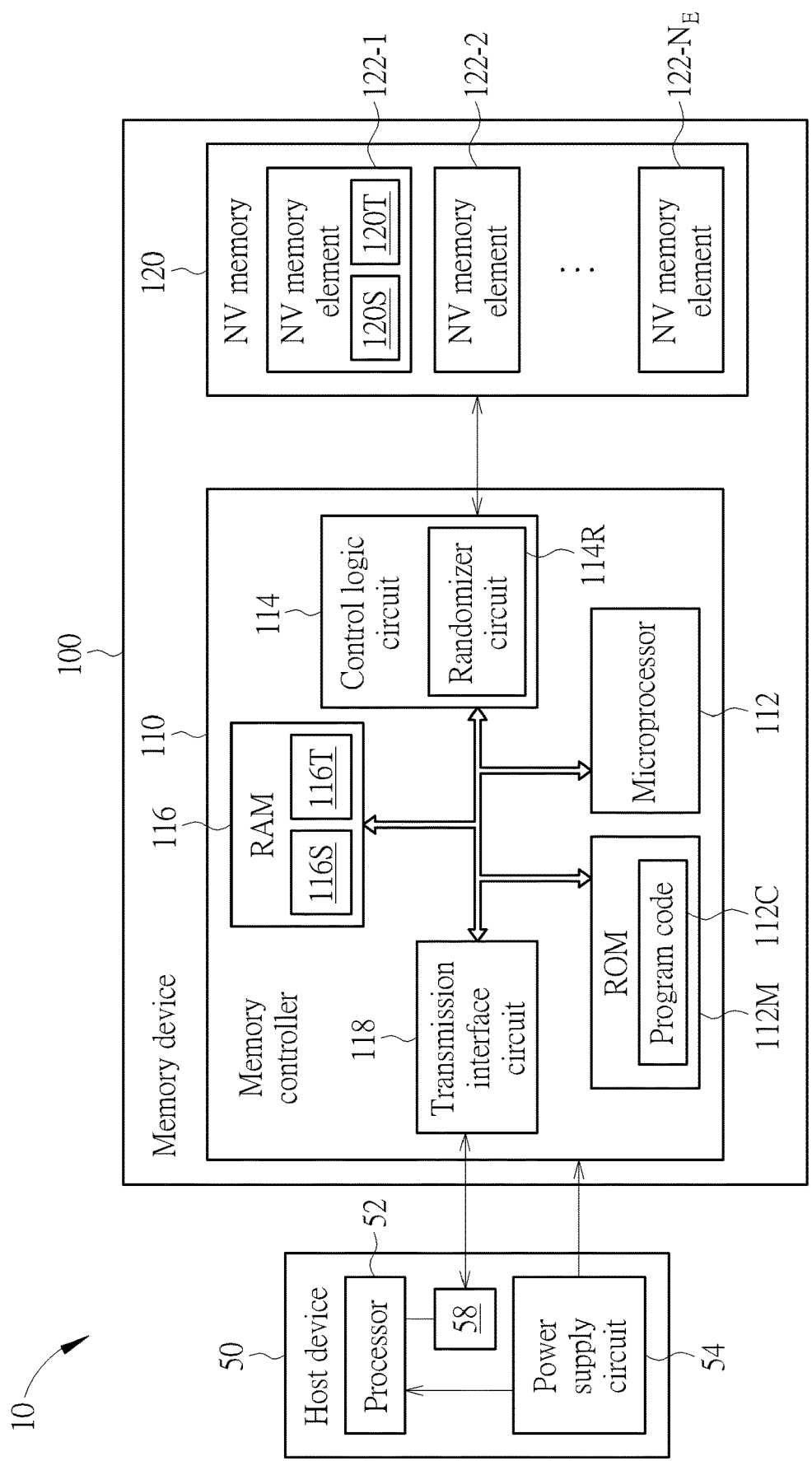
FIG. 1 is a diagram of an electronic device according to an embodiment of the present invention.

FIG. 1 is a diagram of an electronic device 10 according to an embodiment of the present invention, where the electronic device 10 may comprise a host device 50 and a memory device 100. The host device 50 may comprise at least one processor (e.g., one or more processors) which may be collectively referred to as the processor 52, a power supply circuit 54, and a transmission interface circuit 58, where the processor 52 and the transmission interface circuit 58 may be coupled to each other through a bus, and may be coupled to the power supply circuit 54 to obtain power. The processor 52 may be arranged to control operations of the host device 50, and the power supply circuit 54 may be arranged to provide the processor 52, the transmission interface circuit 58, and the memory device 100 with power, and output one or more driving voltages to the memory device 100, where the memory device 100 may provide the host device 50 with storage space, and may obtain the one or more driving voltages from the host device 50, to be the power of the memory device 100. Examples of the host device 50 may include, but are not limited to: a multifunctional mobile phone, a tablet computer, a wearable device, and a personal computer such as a desktop computer and a laptop computer. Examples of the memory device 100 may include, but are not limited to: a portable memory device (e.g., a memory card conforming to the SD/MMC, CF, MS or XD specification), a solid state drive (SSD), and various types of embedded memory devices (e.g., an embedded memory device conforming to the UFS or eMMC specification). According to this embodiment, the memory device 100 may comprise a controller such as a memory controller 110, and may further comprise a non-volatile (NV) memory 120, where the memory controller 110 is arranged to access the NV memory 120, and the NV memory 120 is arranged to store information. The NV memory 120 may comprise at least one NV memory element (e.g., one or more NV memory elements), such as a plurality of NV memory elements 122-1, 122-2, . . . , and 122-NE, where "NE" may represent a positive integer that is greater than one. For example, the NV memory 120 may be a flash memory, and the plurality of NV memory elements 122-1, 122-2, . . . , and 122-NE may be a plurality of flash memory chips or a plurality of flash memory dies, respectively, but the present invention is not limited thereto.

As shown in FIG. 1, the memory controller 110 may comprise a processing circuit such as a microprocessor 112, a storage unit such as a read only memory (ROM) 112M, a control logic circuit 114, a random access memory (RAM) 116 (which may be implemented by way of static random access memory (SRAM), for example), and a transmission interface circuit 118, where at least one portion (e.g., a portion or all) of the above components may be coupled to one another via a bus. The RAM 116 may be arranged to provide the memory controller 110 with internal storage space (for example, may temporarily store information), but the present invention is not limited thereto. In addition, the ROM 112M of this embodiment is arranged to store a program code 112C, and the microprocessor 112 is arranged to execute the program code 112C to control the access of the NV memory 120. Please note that, the program code 112C may also be stored in the RAM 116 or any type of memory. Additionally, the control logic circuit 114 may be arranged to control the NV memory 120. The control logic circuit 114 may comprise a randomizer circuit 114R for performing randomizing and de-randomizing operations, and may further comprise an error correction code (ECC) circuit (not shown in FIG. 1) for performing ECC encoding and ECC decoding, to protect data and/or perform error correction. For example, during a write procedure, the memory controller 110 (e.g., the microprocessor 112) can utilize the randomizer circuit 114R (e.g., a randomizer therein) to perform randomizing operations on data to be written, to generate randomized data and store the randomized data into the NV memory 120. For another example, during a read procedure, the memory controller 110 (e.g., the microprocessor 112) can utilize the randomizer circuit 114R (e.g., a de-randomizer therein) to perform de-randomizing operations on previously stored data such as the randomized data, to generate de-randomized data for preparing the read data to be returned to the host device 50. Regarding the communications between the memory device 100 (e.g., the memory controller 110) and the host device 50, the transmission interface circuit 118 may conform to one or more communications specifications among various communications specifications (e.g., the Serial Advanced Technology Attachment (SATA) specification, Universal Serial Bus (USB) specification, Peripheral Component Interconnect Express (PCIe) specification, Non-Volatile Memory Express (NVMe) specification, embedded Multi Media Card (eMMC) specification, and Universal Flash Storage (UFS) specification), and may perform communications with the host device 50 (e.g., the transmission interface circuit 58) according to the one or more communications specifications for the memory device 100. Similarly, the transmission interface circuit 58 may conform to the one or more communications specifications, and may perform communications with the memory device 100 (e.g., the transmission interface circuit 118) according to the one or more communications specifications for the host device 50.

In this embodiment, the host device 50 may transmit a plurality of host commands and corresponding logical addresses to the memory controller 110, to access the NV memory 120 within the memory device 100, indirectly. The memory controller 110 receives the plurality of host commands and the logical addresses, and translates the plurality of host commands into memory operating commands (which may be referred to as operating commands, for brevity), respectively, and further controls the NV memory 120 with the operating commands to perform reading or writing/programming upon the memory units or data pages of corresponding physical addresses within the NV memory 120, where the physical addresses can be associated with the logical addresses. For example, the memory controller 110 may generate or update at least one logical-to-physical (L2P) address mapping table to manage the relationship between the physical addresses and the logical addresses, where the NV memory 120 may store a global L2P address mapping table 120T, for the memory controller 110 to control the memory device 100 to access data in the NV memory 120, but the present invention is not limited thereto. For another example, the memory controller 110 may generate or update a seed table 120S, for the memory controller 110 to perform data access management of the memory device 100 with aid of randomness-property control.

For better comprehension, the global L2P address mapping table 120T and/or the seed table 120S (e.g., both of the global L2P address mapping table 120T and the seed table 120S) may be located in a predetermined region within the NV memory element 122-1, such as a system region, but the present invention is not limited thereto. For example, the global L2P address mapping table 120T may be divided into a plurality of local L2P address mapping tables, and the local L2P address mapping tables may be stored in one or more of the NV memory elements 122-1, 122-2, . . . , and 122-NE, and more particularly, may be stored in the NV memory elements 122-1, 122-2, . . . , and 122-NE, respectively. When there is a needed, the memory controller 110 may load at least one portion (e.g., a portion or all) of the global L2P address mapping table 120T into the RAM 116 or other memories. For example, the memory controller 110 may load a local L2P address mapping table among the plurality of local L2P address mapping tables into the RAM 116 to be a temporary L2P address mapping table 116T, for accessing data in the NV memory 120 according to the local L2P address mapping table which is stored as the temporary L2P address mapping table 116T, but the present invention is not limited thereto. For another example, the memory controller 110 may load at least one portion (e.g., a portion or all) of the seed table 120S into the RAM 116 or other memories, and more particularly, load a latest seed table such as the latest version of the seed table 120S into the RAM 116 to be a temporary seed table 116S, for performing data access management of the memory device 100 with aid of randomness-property control according to the latest seed table which is stored as the temporary seed table 116S.

In addition, the aforementioned at least one NV memory element (e.g., the one or more NV memory elements such as {122-1, 122-2, . . . , 122-NE}) may comprise a plurality of blocks, where the minimum unit that the memory controller 110 may perform operations of erasing data on the NV memory 120 may be a block, and the minimum unit that the memory controller 110 may perform operations of writing data on the NV memory 120 may be a page, but the present invention is not limited thereto. For example, any NV memory element 122-*n* (where "n" may represent any integer in the interval [1, NE]) among the NV memory elements 122-1, 122-2, . . . , and 122-NE may comprise multiple blocks, and a block within the multiple blocks may comprise and record a specific number of pages, where the memory controller 110 may access a certain page of a certain block within the multiple blocks according to a block address and a page address.

Figure 2:
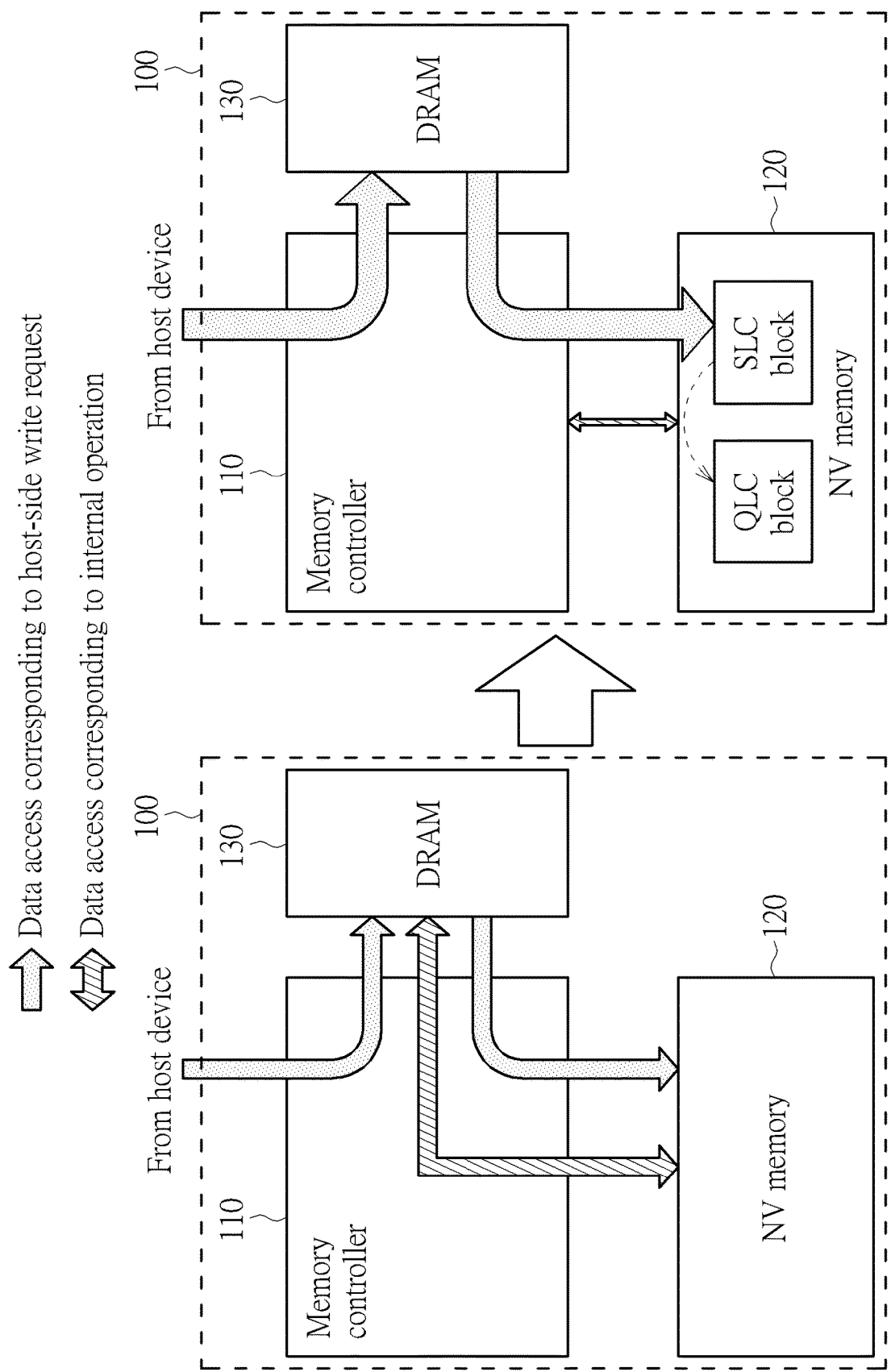
FIG. 2 illustrates, in the right half thereof, a data reception and storage control scheme of a method for performing data access management of a memory device with aid of randomness-property control according to an embodiment of the present invention, where a case that the data reception and storage control function corresponding to the data reception and storage control scheme is temporarily disabled is also illustrated in the left half of FIG. 2 for better comprehension.

FIG. 2 illustrates, in the right half thereof, a data reception and storage control scheme of a method for performing data access management of a memory device (e.g., the memory device 100) with aid of randomness-property control according to an embodiment of the present invention, where a case that the data reception and storage control function corresponding to the data reception and storage control scheme is temporarily disabled is also illustrated in the left half of FIG. 2 for better comprehension, but the present invention is not limited thereto. In addition, the memory device 100 may be equipped with a dynamic random access memory (DRAM) 130.

As shown in the left half of FIG. 2, when the data reception and storage control function is temporarily disabled, the memory controller 110 may spend too much time on performing some internal operations (e.g., garbage collection (GC) operations) of the memory device 100 in response to a plurality of host-side write requests, causing the overall performance to be reduced, and more particularly, may use the DRAM 130 to perform the internal operations of the memory device 100, and/or to buffer write data from the host device 50 during a write procedure. For example, the memory controller 110 may frequently access the DRAM 130 to perform the internal operations of the memory device 100 and occupy the transmission bandwidth of the DRAM 130 (e.g., the data access corresponding to the internal operations may temporarily hinder the data access corresponding to the plurality of host-side write requests), so the transmission bandwidth of the DRAM 130 may be insufficient for direct memory access (DMA) operations performed by the host device 50 during the write procedure, causing the overall performance to be reduced.

As shown in the right half of FIG. 2, based on the data reception and storage control scheme, the memory controller 110 can efficiently perform some internal operations (e.g., seed-aware GC operations) of the memory device 100 in response to a plurality of host-side write requests, and more particularly, can program data into at least one single level cell (SLC) block (e.g., one or more SLC blocks) to be first stored data corresponding to a data reception stage and perform a seed-aware GC procedure to collect valid data among the first stored data of the at least one SLC block into at least one non-SLC block (e.g., one or more non-SLC blocks) such as at least one quadruple level cell (QLC) block (e.g., one or more QLC blocks) to be second stored data corresponding to a data storage stage. For example, during a write procedure, the memory controller 110 can use the DRAM 130 to buffer write data from the host device 50 and prepare the data to be programmed into the at least one SLC block according to the write data buffered in the DRAM 130, where a portion of operations corresponding to the data reception stage and a portion of operations corresponding to the data storage stage may be performed at the same time. As the memory controller 110 can perform the seed-aware GC procedure without using DRAM 130, performing the seed-aware GC procedure will not occupy the transmission bandwidth of the DRAM 130 (e.g., the data access corresponding to the internal operations such as the seed-aware GC operations will not hinder the data access corresponding to the plurality of host-side write requests), so the transmission bandwidth of the DRAM 130 can be sufficient for DMA operations performed by the host device 50 during the write procedure. As a result, the overall performance can be enhanced.

For better comprehension, the data access corresponding to the internal operations such as the seed-aware GC operations may be illustrated between the memory controller 110 and the NV memory 120, but the present invention is not limited thereto. According to some embodiments, the memory controller 110 can utilize an internal buffer of the NV memory 120 to buffer partial data read from a set of pages (e.g., four pages, for the case that the at least one non-SLC block represent the at least one QLC block) of the at least one SLC block, and program the buffered partial data into a hybrid page (e.g., multiple concurrently accessed pages) of the at least one non-SLC block (e.g., the at least one QLC block), such as multiple pages that correspond to the same word-line (WL) in the memory cell architecture of the any NV memory element 122-*n* within the NV memory 120 and should be concurrently accessed, where both of an operation of reading the partial data from the NV memory 120 by the memory controller 110 and an operation of writing the partial data into the NV memory 120 by the memory controller 110 are not required. More particularly, the memory controller 110 can maintain at least one seed table (e.g., one or more seed tables) such as the seed tables 120S and/or 116S, and select target data in a set of target pages as the partial data in the set of pages according to the at least one seed table, to guarantee the randomness-properties of the target data in the set of target pages, such as the randomness-properties of the partial data in the set of pages, and therefore guarantee reliability of the partial data programmed into this hybrid page of the at least one non-SLC block (e.g., the at least one QLC block). Based on the data reception and storage control scheme, it can be achieved that the data access corresponding to the internal operations such as the seed-aware GC operations is totally within the NV memory 120 and does exist on a data path between the memory controller 110 and the NV memory 120. As a result, the data access corresponding to the internal operations between the memory controller 110 and the NV memory 120 as shown in the right half of FIG. 2 can be removed.

Regarding the multiple-bits-per-memory-cell characteristic of the at least one non-SLC block (e.g., multiple level cell (MLC) block, triple level cell (TLC) block and QLC block), the hybrid page such as the multiple pages corresponding to the same WL should be concurrently accessed (e.g., programmed or read) to allow the multiple bits of each memory cell of all memory cells accessed through this WL to be accessed correspondingly. The page count CNT_PAGE of the multiple pages corresponding to the same WL is typically equal to the bit count per memory cell CNT_BIT_PER_CELL. Taking the QLC block as an example, CNT_PAGE=CNT_BIT_PER_CELL=4, and the multiple pages corresponding to the same WL may be referred to as a top page, an upper page, a middle page and a lower page. Additionally, for any memory cell of all memory cells accessed through this WL, the respective bits of the top page, the upper page, the middle page and the lower page may be expressed with a gray code system according to a certain programming state among 16 candidate programming states (e.g., $2^4$=16).

According to some embodiments, the hybrid page of the QLC block should be programmed twice, for example, in a coarse programming manner for the first time and in a fine programming manner for the second time, to achieve the best programming results. In this situation, the memory controller 110 that is operating according to the data reception and storage control scheme can greatly enhance the overall performance, where applying the data reception and storage control scheme to the memory device 100 can save the associated costs of the DRAM 130.

Figure 3:
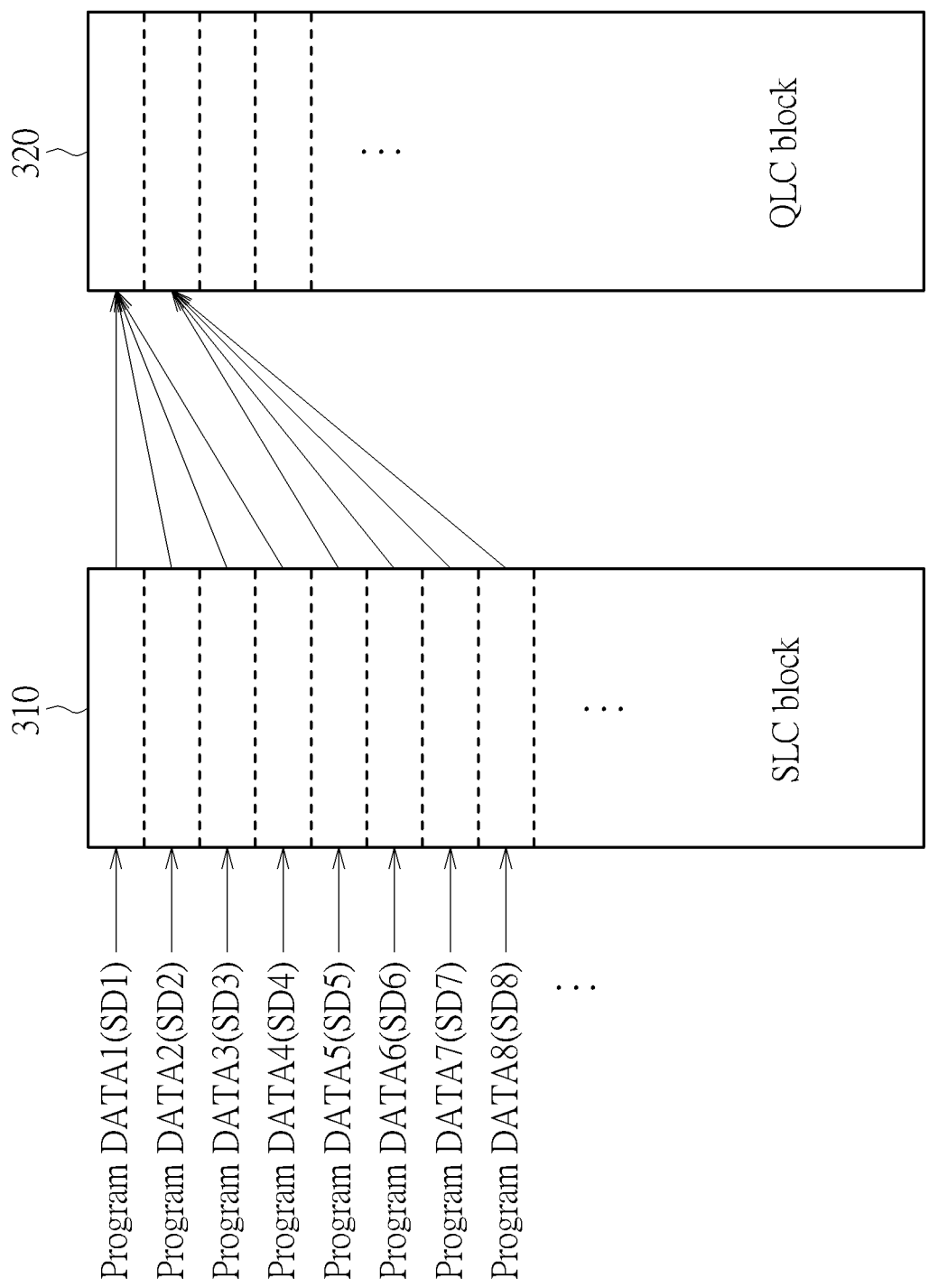
FIG. 3 illustrates some implementation details of a data reception stage and a data storage stage in the data reception and storage control scheme shown in FIG. 2 according to an embodiment of the present invention.

FIG. 3 illustrates some implementation details of the data reception stage and the data storage stage in the data reception and storage control scheme shown in FIG. 2 according to an embodiment of the present invention. For example, the aforementioned at least one non-SLC block may represent the aforementioned at least one QLC block, but the present invention is not limited thereto.

In response to the plurality of host-side write requests, the memory controller 110 can program the data {DATA1(SD1), DATA2(SD2), DATA3(SD3), DATA4(SD4), DATA5(SD5), DATA6(SD6), DATA7(SD7), DATA8(SD8), . . . } into a certain SLC block 310 among the aforementioned at least one SLC block to be the first stored data corresponding to the data reception stage, and perform the seed-aware GC procedure to collect the valid data among the first stored data of the SLC block 310 into a certain QLC block 320 among the aforementioned at least one QLC block to be the second stored data corresponding to the data storage stage. For example, during the write procedure, the memory controller 110 can use the DRAM 130 to buffer the write data from the host device 50 and prepare the data {DATA1(SD1), DATA2(SD2), DATA3(SD3), DATA4(SD4), DATA5(SD5), DATA6(SD6), DATA7(SD7), DATA8(SD8), . . . } to be programmed into the SLC block 310 according to the write data buffered in the DRAM 130, where the data {DATA1(SD1), DATA2(SD2), DATA3(SD3), DATA4(SD4), DATA5(SD5), DATA6(SD6), DATA7(SD7), DATA8(SD8), . . . } can have been randomized with the seeds {SD1, SD2, SD3, SD4, SD5, SD6, SD7, SD8, . . . } by utilizing the randomizer circuit 114R (e.g., the randomizer therein), respectively.

Assume that the host device 50 does not perform any overwrite operation in this write procedure. For example, the host device 50 may have sent one or more host write commands to the memory device 100 (e.g., the memory controller 110) to ask for writing the write data at a plurality of logical addresses, and no host write command among the one or more host write commands is asking for re-writing at any logical address among the plurality of logical addresses again. As a result, all of the data {DATA1(SD1), DATA2(SD2), DATA3(SD3), DATA4(SD4), DATA5(SD5), DATA6(SD6), DATA7(SD7), DATA8(SD8), . . . } stored in the SLC block 310 can be regarded as valid data. In addition, the memory controller 110 can prepare the seeds {SD1, SD2, SD3, SD4, SD5, SD6, SD7, SD8, . . . } according to at least one predetermined rule (e.g., one or more predetermined rules) to guarantee the randomness-properties of the data {DATA1(SD1), DATA2(SD2), DATA3(SD3), DATA4(SD4), DATA5(SD5), DATA6(SD6), DATA7(SD7), DATA8(SD8), . . . }, and more particularly, to make the randomness-properties of the data {DATA1(SD1), DATA2(SD2), DATA3(SD3), DATA4(SD4), DATA5(SD5), DATA6(SD6), DATA7(SD7), DATA8(SD8), . . . } be suitable for reliable storage in any block (e.g., each block) among the SLC block 310 and the QLC block 320, where the associated programming state distribution of the any block (e.g., said each block) among the SLC block 310 and the QLC block 320 can be very uniform. Therefore, the memory controller 110 can trigger a series of internal copy operations of the NV memory 120 to directly program the data {{DATA1(SD1), DATA2(SD2), DATA3(SD3), DATA4(SD4)}, {DATA5 (SD5), DATA6(SD6), DATA7(SD7), DATA8(SD8)}, . . . } into a series of hybrid pages in the QLC block 320, having no need to change any seed among the seeds {SD1, SD2, SD3, SD4, SD5, SD6, SD7, SD8, . . . }. For brevity, similar descriptions for this embodiment are not repeated in detail here.

According to some embodiments, as the storage volume of the internal buffer of the NV memory 120 may be very small, changing any seed among the seeds {SD1, SD2, SD3, SD4, SD5, SD6, SD7, SD8, . . . } may need to read the associated partial data (e.g., the partial data that has been randomized with the any seed) from the NV memory 120 by the memory controller 110 for further processing, in order to prevent any data loss of any other partial data currently buffered in the internal buffer of the NV memory 120. By properly preparing the seeds {SD1, SD2, SD3, SD4, SD5, SD6, SD7, SD8, . . . } according to at least one predetermined rule (e.g., one or more predetermined rules) in advance, the memory controller 110 can guarantee the randomness-properties of the data {DATA1(SD1), DATA2 (SD2), DATA3(SD3), DATA4(SD4), DATA5(SD5), DATA6 (SD6), DATA7(SD7), DATA8(SD8), . . . }, and can prevent changing any seed among the seeds {SD1, SD2, SD3, SD4, SD5, SD6, SD7, SD8, . . . }, and therefore can trigger the series of internal copy operations of the NV memory 120 to directly program the data {{DATA1(SD1), DATA2(SD2), DATA3(SD3), DATA4(SD4)}, {DATA5(SD5), DATA6 (SD6), DATA7(SD7), DATA8(SD8)}, . . . } into the QLC block 320 without reducing the storage reliability of the QLC block 320. For brevity, similar descriptions for these embodiments are not repeated in detail here.

According to some embodiments, the seeds {SD1, SD2, SD3, SD4, SD5, SD6, SD7, SD8, . . . } can be prepared according to the aforementioned at least one predetermined rule in advance by another device such as a production tool, and can be loaded into a predetermined seed pool within the NV memory 120 during a production phase of the memory device 100, to allow the memory controller 110 to obtain the seeds {SD1, SD2, SD3, SD4, SD5, SD6, SD7, SD8, . . . } from the NV memory 120 (e.g., the predetermined seed pool therein) when there is a need, where the predetermined seed pool can be positioned within the aforementioned predetermined region within the NV memory element 122-1, such as the system region, and the production tool can be implemented in a similar manner as that of the host device 50, but the present invention is not limited thereto. For brevity, similar descriptions for these embodiments are not repeated in detail here.

Figure 4:
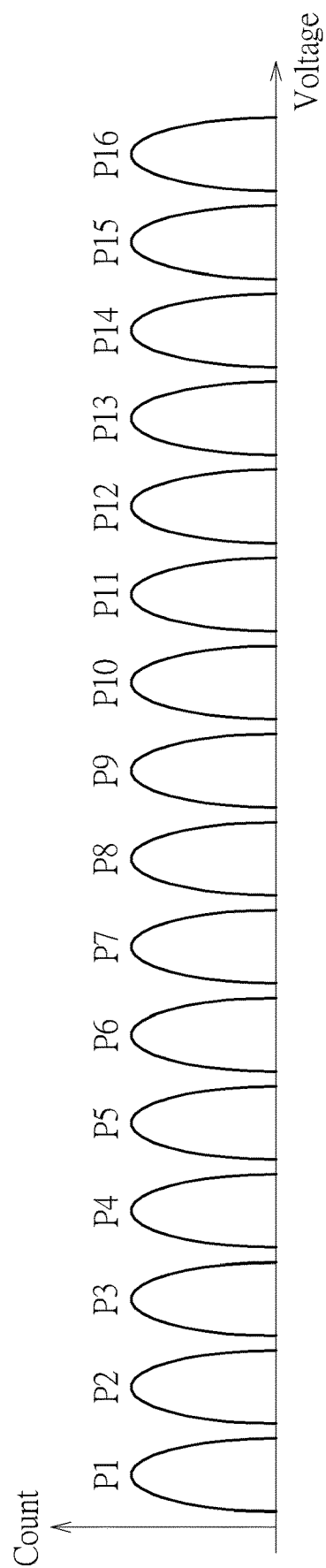
FIG. 4 illustrates an example of a programming state distribution of a physical block in a situation where the data reception and storage control scheme shown in FIG. 2 is applied to the memory device shown in FIG. 1.

FIG. 4 illustrates an example of a programming state distribution of a physical block (e.g., a certain non-SLC block among the aforementioned at least one non-SLC block) in a situation where the data reception and storage control scheme shown in FIG. 2 is applied to the memory device 100 shown in FIG. 1. For example, the aforementioned at least one non-SLC block may represent the aforementioned at least one QLC block, and this physical block may represent a certain non-SLC block among the aforementioned at least one non-SLC block, such as the QLC block 320 among the aforementioned at least one QLC block, but the present invention is not limited thereto. In addition, the horizontal axis may represent the voltage such as a threshold voltage for sensing bit information in a memory cell, and the vertical axis may represent the count such as the memory cell count of all memory cells in this physical block such as the QLC block 320. As the seeds {SD1, SD2, SD3, SD4, SD5, SD6, SD7, SD8, . . . } can be properly prepared according to the aforementioned at least one predetermined rule in advance, for example, by the memory controller 110 or by the other device such as the production tool, the randomness-properties of the data {DATA1 (SD1), DATA2(SD2), DATA3(SD3), DATA4 (SD4), DATA5(SD5), DATA6(SD6), DATA7(SD7), DATA8 (SD8), . . . } can be guaranteed, and the programming states P1, P2, P3, P4, P5, P6, P7, P8, P9, P10, P11, P12, P13, P14, P15 and P16 can be very uniform, as shown in FIG. 4. For brevity, similar descriptions for this embodiment are not repeated in detail here.

Figure 5:
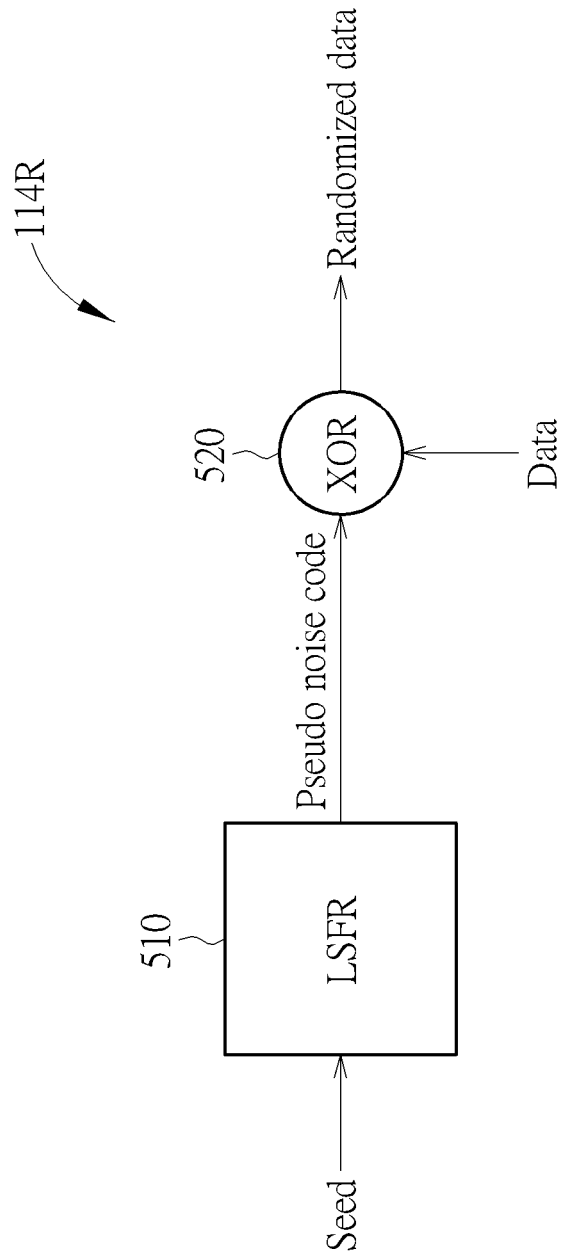
FIG. 5 illustrates some implementation details of a randomizer circuit in the memory device shown in FIG. 1 according to an embodiment of the present invention.

FIG. 5 illustrates some implementation details of the randomizer circuit 114R in the memory device 100 shown in FIG. 1 according to an embodiment of the present invention. The randomizer circuit 114R (e.g., the randomizer therein) may comprise a linear feedback shift register (LSFR) circuit 510 and an exclusive OR (XOR) circuit 520 (respectively labeled "LSFR" and "XOR" for brevity), where the LSFR circuit 510 may comprise at least one LSFR (e.g., one or more LSFRs), and the XOR circuit 520 may comprise at least one XOR gate (e.g., one or more XOR gates). In addition, the LSFR circuit 510 can generate a pseudo noise code according to a seed (e.g., any seed among the seeds {SD1, SD2, SD3, SD4, SD5, SD6, SD7, SD8, . . . }). According to the pseudo noise code, the XOR circuit 520 can randomize the input data (labeled "Data" for brevity), such as the non-randomized data that has not been processed with the randomizing operation, to generate the randomized data (e.g., one of the data {DATA1(SD1), DATA2(SD2), DATA3(SD3), DATA4(SD4), DATA5(SD5), DATA6(SD6), DATA7(SD7), DATA8(SD8), . . . }, such as the partial data corresponding to the any seed). For brevity, similar descriptions for this embodiment are not repeated in detail here.

According to some embodiments, the memory controller 110 can obtain the seeds {SD1, SD2, SD3, SD4, SD5, SD6, SD7, SD8, . . . } from the predetermined seed pool within the NV memory 120 to prepare the data {DATA1(SD1), DATA2 (SD2), DATA3(SD3), DATA4(SD4), DATA5(SD5), DATA6 (SD6), DATA7(SD7), DATA8(SD8), . . . } to enhance the overall performance. For example, the seed count of all seeds in the predetermined seed pool may be greater than or equal to 2000, but the present invention is not limited thereto. For another example, the predetermined seed pool may comprise much more seeds. In addition, as the seed count of all seeds in the predetermined seed pool is typically unchangeable after the production phase of the memory device 100, the memory controller 110 may need to perform randomness-property checking operations to prevent any possible error when there is a need, in order to guarantee the overall performance.

TABLE 1

| PPA | Seed | SEED_RSV |
|---|---|---|
| W0 | $SD_{W0}$ | 0 |
| X0 | $SD_{X0}$ | 0 |
| Y0 | $SD_{Y0}$ | 0 |
| Z0 | $SD_{Z0}$ | 0 |
| . . . | . . . | . . . |

Table 1 illustrates an example of the seed table 120S (or the seed table 116S) for the case that the aforementioned at least one SLC block comprises a single physical block having a physical block address (PBA) (e.g., the PBA PBA0). For better comprehension, the aforementioned at least one non-SLC block may represent the aforementioned at least one QLC block, but the present invention is not limited thereto. In addition, when performing the operations shown in the left half of FIG. 3, the memory controller 110 can obtain the seeds {SD1, SD2, SD3, SD4, SD5, SD6, SD7, SD8, . . . } from the predetermined seed pool within the NV memory 120 to prepare the data {DATA1(SD1), DATA2 (SD2), DATA3(SD3), DATA4(SD4), DATA5(SD5), DATA6 (SD6), DATA7(SD7), DATA8(SD8), . . . }, and program the data {DATA1(SD1), DATA2(SD2), DATA3(SD3), DATA4 (SD4), DATA5(SD5), DATA6(SD6), DATA7(SD7), DATA8 (SD8), . . . } into the single physical block such as the SLC block 310 and record the seeds {SD1, SD2, SD3, SD4, . . . } into the seed table 120S (or the seed table 116S) to be the seeds {$SD_{W0}$, $SD_{X0}$, $SD_{Y0}$, $SD_{Z0}$, . . . }. For example, the memory controller 110 can record the associated physical page addresses (PPAs) {W0, X0, Y0, Z0, . . . } of the physical pages in the single physical block (e.g., the SLC block 310) as well as a default value (e.g., the logic value 0) of the flag SEED_RSV into the seed table 120S (or the seed table 116S), but the present invention is not limited thereto. For another example, in a situation where the PPAs {W0, X0, Y0, Z0, . . . } (e.g., the PPAs {0, 1, 2, 3, . . . }) correspond to the table entry locations of the seed table 120S (or the seed table 116S), it is unnecessary to record the PPAs {W0, X0, Y0, Z0, . . . } (e.g., the PPAs {0, 1, 2, 3, . . . }) into the seed table 120S (or the seed table 116S).

Regarding the operations shown in the right half of FIG. 3, the SLC block 310 and the QLC block 320 can be regarded as the source block and the destination block of the seed-aware GC procedure, respectively. As any overwrite operation performed by the host device 50 may cause the data stored in one or more pages among the pages in the source block (e.g., the SLC block 310) to become invalid data, it is unnecessary to program the data stored in the one or more pages into the destination block (e.g., the QLC block 320), and therefore, one or more of the data {DATA1 (SD1), DATA2(SD2), DATA3(SD3), DATA4(SD4), DATA5 (SD5), DATA6(SD6), DATA7(SD7), DATA8(SD8), . . . } will not be programmed into the destination block, where one or more seeds among the seeds {SD1, SD2, SD3, SD4, SD5, SD6, SD7, SD8, . . . } that are properly prepared for reliable storage in the destination block (e.g., the QLC block 320) may not work properly to guarantee the randomness-properties of the data being programmed into the destination block since the sequence of the seeds {SD1, SD2, SD3, SD4, SD5, SD6, SD7, SD8, . . . } is broken by the overwrite behavior of the host device 50.

During the seed-aware GC procedure, the memory controller 110 can perform one or more randomness-property checking operations to properly select the target data to be programmed into the same hybrid page of the destination block (e.g., the QLC block 320) and reserve the non-selected data for a next round of programming, to correct the broken seed-sequence issue due to the overwrite behavior of the host device 50, and more particularly, to guarantee the randomness-properties of the data being programmed into the destination block. For example, when determining the data stored in a certain page of the source block to be the non-selected data at this moment, the memory controller 110 can set the flag SEED_RSV of this page to be a first predetermined value (e.g., the logic value 1) for indicating that the data of this page is reserved for the next round of programming. Afterward, when selecting the data of this page as the latest target data to be programmed into another hybrid page (e.g., a subsequent hybrid page such as the next hybrid page) of the destination block, the memory controller 110 can program the data of this page, as well as other valid data of one or more other pages in the source block, into the other hybrid page (e.g., the subsequent hybrid page such as the next hybrid page) of the destination block. For brevity, similar descriptions for this embodiment are not repeated in detail here.

TABLE 2

| PPA | Seed | SEED_RSV |
|---|---|---|
| W0 | $SD_{W0}$ | 0 |
| X0 | $SD_{X0}$ | 0 |
| Y0 | $SD_{Y0}$ | 1 |
| Z0 | $SD_{Z0}$ | 0 |
| ... | ... | ... |

Table 2 illustrates another example of the seed table 120S (or the seed table 116S) for the case that the aforementioned at least one SLC block comprises the single physical block having the PBA (e.g., the PBA PBA0). Assume that, among the data {$DATA_{W0}(SD_{W0})$, $DATA_{X0}(SD_{X0})$, $DATA_{Y0}(SD_{Y0})$, $DATA_{Z0}(SD_{Z0})$, ... } (e.g., the data {DATA1(SD1), DATA2(SD2), DATA3(SD3), DATA4(SD4), ... }) of the pages having the PPAs {W0, X0, Y0, Z0, ... } in the source block (e.g., the SLC block 310), the seed $SD_{Y0}$ does not pass a randomness-property checking operation, and therefore the data $DATA_{Y0}(SD_{Y0})$ (e.g., the data DATA3(SD3)) is not suitable for being used as any portion of the target data at this moment. When determining the data $DATA_{Y0}(SD_{Y0})$ (e.g., the data DATA3(SD3)) stored in the page having the PPA Y0 in the source block to be the non-selected data at this moment, the memory controller 110 can set the flag SEED_RSV of the page having the PPA Y0 to be the first predetermined value (e.g., the logic value 1) for indicating that the data $DATA_{Y0}(SD_{Y0})$ of this page is reserved for the next round of programming. For brevity, similar descriptions for this embodiment are not repeated in detail here.

TABLE 3

| PBA | PPA | Seed | SEED_RSV |
|---|---|---|---|
| PBA0 | W0 | $SD_{W0}$ | 0 |
| PBA0 | X0 | $SD_{X0}$ | 0 |
| PBA0 | Y0 | $SD_{Y0}$ | 0 |
| PBA0 | Z0 | $SD_{Z0}$ | 0 |
| ... | ... | ... | ... |
| PBA1 | W1 | $SD_{W1}$ | 0 |
| PBA1 | X1 | $SD_{X1}$ | 0 |
| PBA1 | Y1 | $SD_{Y1}$ | 0 |
| PBA1 | Z1 | $SD_{Z1}$ | 0 |
| ... | ... | ... | ... |

Table 3 illustrates an example of the seed table 120S (or the seed table 116S) for the case that the aforementioned at least one SLC block comprises multiple physical blocks respectively having multiple PBAs (e.g., the PBAs PBA0 and PBA1). In response to the change in the block count of the aforementioned at least one SLC block, the memory controller 110 can record the PBAs PBA0, PBA1, etc. into the field "PBA", record the associated PPAs {W0, X0, Y0, Z0, ... }, {W1, X1, Y1, Z1, ... }, ... } of the physical pages in the multiple physical blocks into the field "PPA" respectively, record the seeds {{$SD_{W0}$, $SD_{X0}$, $SD_{Y0}$, $SD_{Z0}$, ... }, {$SD_{W1}$, $SD_{X1}$, $SD_{Y1}$, $SD_{Z1}$, ... }, ... } that have been used for randomizing the data {{$DATA_{W0}(SD_{W0})$, $DATA_{X0}(SD_{X0})$, $DATA_{Y0}(SD_{Y0})$, $DATA_{Z0}(SD_{Z0})$, ... }, {$DATA_{W1}(SD_{W1})$, $DATA_{X1}(SD_{X1})$, $DATA_{Y1}(SD_{Y1})$, $DATA_{Z1}(SD_{Z1})$, ... }, ... } of these pages into the field "Seed" respectively, and record the default value (e.g., the logic value 0) of the flag SEED_RSV respectively. For brevity, similar descriptions for this embodiment are not repeated in detail here.

According to some embodiments, the memory controller 110 can collect one or more table entries corresponding to SEED_RSV=1 among the table entries of the seed table 120S (or the seed table 116S) into a sub-table, such as another section in the seed table 120S (or the seed table 116S), to be a seed reservation pool. For example, the memory controller 110 can still keep the field "SEED_RSV" for further reference. For another example, the memory controller 110 can omit the field "SEED_RSV" after collecting the one or more table entries into the seed reservation pool. In some examples, it is unnecessary to record the flag SEED_RSV into the seed table 120S (or the seed table 116S). For brevity, similar descriptions for these embodiments are not repeated in detail here.

Figure 6:
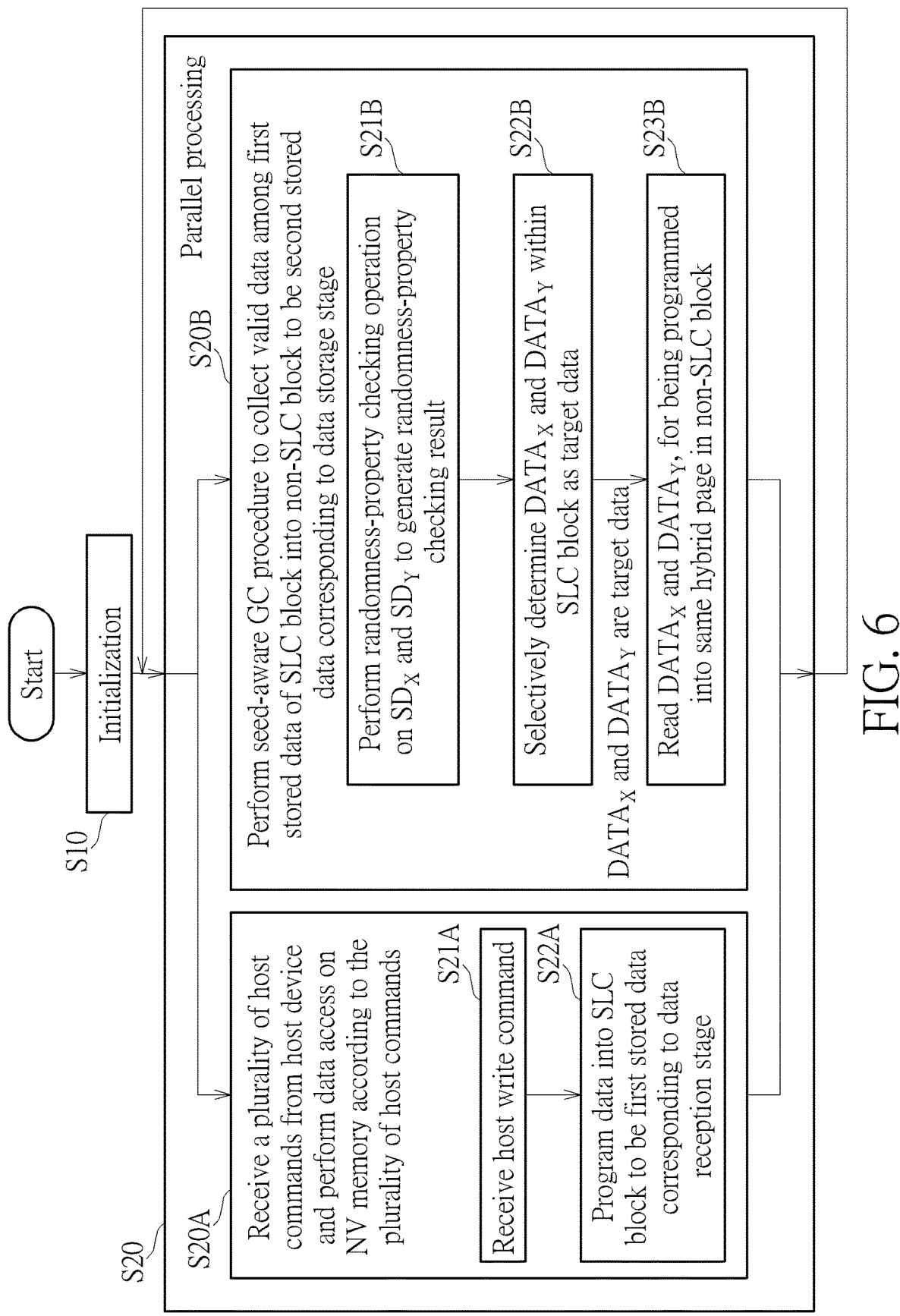
FIG. 6 is a flowchart of the method according to an embodiment of the present invention.

FIG. 6 is a flowchart of the method according to an embodiment of the present invention, where the method can be applied to the memory device 100 shown in FIG. 1, and more particularly, the memory controller 110 and the components thereof.

In Step S10, the memory device 100 (e.g., the memory controller 110) can perform initialization, for example, during a boot up of the memory device 100.

In Step S20, the memory device 100 (e.g., the memory controller 110) can perform parallel processing, and more particularly, perform the operations of Steps S20A and 520B in a parallel manner.

In Step S20A, the memory device 100 (e.g., the memory controller 110) can receive the plurality of host commands from the host device 50 through the transmission interface circuit 118 of the memory controller 110 and perform data access on the NV memory 120 according to the plurality of host commands. For example, receiving the plurality of host commands from the host device 50 through the transmission interface circuit 118 of the memory controller 110 and performing the data access on the NV memory 120 according to the plurality of host commands may comprise the operations of Steps S21A and S22A.

In Step S21A, the memory device 100 (e.g., the memory controller 110) can receive at least one host write command (e.g., one or more host write commands) among the plurality of host commands from the host device 50.

In Step S22A, in response to the aforementioned at least one host write command among the plurality of host commands, the memory device 100 (e.g., the memory controller 110) can program data into the aforementioned at least one SLC block (e.g., the SLC block 310) to be the first stored data corresponding to the data reception stage.

In Step S20B, the memory device 100 (e.g., the memory controller 110) can perform the seed-aware GC procedure to collect the valid data among the first stored data of the aforementioned at least one SLC block (e.g., the SLC block 310) into the aforementioned at least one non-SLC block (e.g., the QLC block 320) to be the second stored data corresponding to the data storage stage. For example, the seed-aware GC procedure may comprise the operations of Steps S21B, S22B and S23B.

For better comprehension, the bit count per memory cell for a plurality of memory cells within the aforementioned at least one non-SLC block (e.g., the QLC block 320) is typically greater than one. For example, the aforementioned at least one non-SLC block may represent at least one MLC block, and the bit count per memory cell may be greater than or equal to two. For another example, the aforementioned at least one non-SLC block may represent at least one TLC block, and the bit count per memory cell may be equal to three. For yet another example, the aforementioned at least one non-SLC block may represent the aforementioned at least one QLC block, and the bit count per memory cell may be equal to four. In some examples, the aforementioned at least one non-SLC block may represent at least one block having a storage density per memory cell higher than that of a QLC block, and the bit count per memory cell may be greater than four.

In Step S21B, the memory device 100 (e.g., the memory controller 110) can perform at least one randomness-property checking operation (e.g., one or more randomness-property checking operations) on a plurality of seeds to generate at least one randomness-property checking result (e.g., one or more randomness-property checking results), and more particularly, perform a randomness-property checking operation on the seeds $SD_X$ and $SD_Y$ to generate a randomness-property checking result.

In Step S22B, according to the aforementioned at least one randomness-property checking result such as the randomness-property checking result of the seeds $SD_X$ and $SD_Y$, the memory device 100 (e.g., the memory controller 110) can selectively determining the data $DATA_X$ of a page #X within the at least one SLC block (e.g., the SLC block 310) and the data $DATA_Y$ of a page #Y within the at least one SLC block (e.g., the SLC block 310) as a set of target data for being programmed into a same hybrid page in the at least one non-SLC block (e.g., the QLC block 320) with at least one internal copy operation (e.g., the arrow from the SLC block to the QLC block shown in the right half of FIG. 2, or a set of arrows among the arrows from the SLC block 310 to the QLC block 320), where the data $DATA_X$ is randomized with the seed $SD_X$ before the data $DATA_X$ is programmed into the page #X in the data reception stage, and the data $DATA_Y$ is randomized with the seed $SD_Y$ before the data $DATA_Y$ is programmed into the page #Y in the data reception stage.

In Step S23B, in response to the data $DATA_X$ and $DATA_Y$ being determined as the set of target data (labeled "$DATA_X$ and $DATA_Y$ are target data" for brevity), the memory device 100 (e.g., the memory controller 110) can read the data $DATA_X$ from the page #X and read the data $DATA_Y$ from the page #Y, for being programmed into the same hybrid page in the at least one non-SLC block (e.g., the QLC block 320) with the at least one internal copy operation, where the valid data may comprise the data $DATA_X$ and $DATA_Y$.

As shown in FIG. 6, the memory device 100 (e.g., the memory controller 110) can perform the parallel processing with respect to the subsequent host commands from the host device 50, to perform data access management of the memory device 100 with aid of randomness-property control in an online manner. For brevity, similar descriptions for this embodiment are not repeated in detail here.

For better comprehension, the method may be illustrated with the working flow shown in FIG. 6, but the present invention is not limited thereto. According to some embodiments, one or more steps may be added, deleted, or changed in the working flow shown in FIG. 6. For example, the seed-aware GC procedure may comprise:

(1) performing a first randomness-property checking operation on a first seed (e.g., the seed $SD_X$) and a second seed (e.g., the seed $SD_Y$) to generate a first randomness-property checking result;

(2) according to the first randomness-property checking result, selectively determining first data (e.g., the data $DATA_X$) of a first page within the at least one SLC block (e.g., the SLC block 310) and second data (e.g., the data $DATA_Y$) of a second page within the at least one SLC block (e.g., the SLC block 310) as a first set of target data for being programmed into the same hybrid page in the at least one non-SLC block (e.g., the QLC block 320) with the aforementioned at least one internal copy operation of the NV memory 120, where the first data (e.g., the data $DATA_X$) is randomized with the first seed (e.g., the seed $SD_X$) before the first data (e.g., the data $DATA_X$) is programmed into the first page in the data reception stage, and the second data (e.g., the data $DATA_Y$) is randomized with the second seed (e.g., the seed $SD_Y$) before the second data (e.g., the data $DATA_Y$) is programmed into the second page in the data reception stage; and (3) in response to the first data (e.g., the data $DATA_X$) and the second data (e.g., the data $DATA_Y$) being determined as the first set of target data, reading the first data (e.g., the data $DATA_X$) from the first page and reading the second data (e.g., the data $DATA_Y$) from the second page, for being programmed into the same hybrid page in the at least one non-SLC block (e.g., the QLC block 320) with the at least one internal copy operation of the NV memory 120, where the valid data comprises the first data and the second data;

but the present invention is not limited thereto. For another example, the seed-aware GC procedure may further comprise:

(1) performing a second randomness-property checking operation on the first seed (e.g., the seed $SD_X$) and a third seed (e.g., the seed $SD_Z$) to generate a second randomness-property checking result;

(2) according to the second randomness-property checking result, selectively determining the first data (e.g., the data $DATA_X$) of the first page within the at least one SLC block (e.g., the SLC block 310) and third data (e.g., the data $DATA_Z$) of a third page within the at least one SLC block (e.g., the SLC block 310) as a second set of target data for being programmed into the same hybrid page in the at least one non-SLC block (e.g., the QLC block 320) with the aforementioned at least one internal copy operation of the NV memory 120, where the third data (e.g., the data $DATA_Z$) is randomized with the third seed (e.g., the seed $SD_Z$) before the third data (e.g., the data $DATA_Z$) is programmed into the third page in the data reception stage; and (3) if the first data (e.g., the data $DATA_X$) and the third data (e.g., the data $DATA_Z$) are determined as the second set of target data, reading the third data (e.g., the data $DATA_Z$) from the third page, for being programmed into the same hybrid page in the at least one non-SLC block (e.g., the QLC block 320) with the at least one internal copy operation of the NV memory 120, otherwise, in a situation where the first data (e.g., the data $DATA_X$) and the third data (e.g., the data $DATA_Z$) are not determined as the second set of target data, reserving the third data (e.g., the data $DATA_Z$) for a next round of programming in the data storage stage, where the valid data further comprises the third data;

wherein, regarding reserving the third data (e.g., the data $DATA_Z$) for the next round of programming in the data storage stage, the third data is reserved for being programmed into another hybrid page in the at least one non-SLC block with at least one other internal copy operation of the NV memory 120. In addition, the first randomness-property checking result may indicate a randomness-property of the second seed (e.g., the seed $SD_Y$) with respect to the first seed (e.g., the seed $SD_X$), for indicating a randomness-property of the second data (e.g., the data $DATA_Y$) with respect to the first data (e.g., the data $DATA_X$), and the second randomness-property checking result may indicate a randomness-property of the third seed (e.g., the seed $SD_Z$) with respect to the first seed (e.g., the seed $SD_X$), for indicating a randomness-property of the third data (e.g., the data $DATA_Z$) with respect to the first data (e.g., the data $DATA_X$).

According to some embodiments, the seed-aware GC procedure may further comprise:

(1) performing an initial checking operation on the first seed (e.g., the seed $SD_X$) and another seed (e.g., the seed $SD_W$) to generate an initial checking result, where a first time point of performing the initial checking operation is earlier than a second time point of performing the first randomness-property checking operation; and (2) according to the initial checking result, selectively determining the first data (e.g., the data $DATA_X$) of the first page within the at least one SLC block (e.g., the SLC block 310) and other data (e.g., the data $DATA_W$) of another page within the at least one SLC block (e.g., the SLC block 310) as another set of target data for being programmed into the same hybrid page in the at least one non-SLC block with the aforementioned at least one internal copy operation of the NV memory 120, where the other data (e.g., the data $DATA_W$) is randomized with the other seed (e.g., the seed $SD_W$) before the other data (e.g., the data $DATA_W$) is programmed into said another page in the data reception stage;

where the initial checking operation may comprise one or a combination of a randomness-property checking operation and an equal-value checking operation (e.g., an operation of checking whether $SD_X=SD_W$).

According to some embodiments, in the seed-aware GC procedure, the memory device 100 (e.g., the memory controller 110) can perform a plurality of randomness-property checking operations (e.g., the randomness-property checking operations described above, such as the randomness-property checking operation for implementing the initial checking operation, the first randomness-property checking operation and the second randomness-property checking operation) on the associated seeds (e.g., the seeds being checked) according to a plurality of predetermined seed-checking rules. For example, the plurality of predetermined seed-checking rules may comprise:

(1) any two seeds among the associated seeds are not equal to each other;

(2) the bit-wise XOR operation result of any two seeds among the associated seeds is not equal to any other seed among the associated seeds; and (3) the bit-wise inverted result of the bit-wise XOR operation result of any two seeds among the associated seeds is not equal to any other seed among the associated seeds;

but the present invention is not limited thereto. For another example, the plurality of predetermined seed-checking rules may further comprise one or more additional seed-checking rules. For better comprehension, the memory device 100 (e.g., the memory controller 110) may perform the following operations:

(1) the memory controller 110 may obtain two new seeds such as the seeds $SD_X$ and $SD_Y$ first, where these two new seed should be different from each other;

(2) the memory controller 110 may obtain another new seed such as the seed $SD_Z$, and perform a bit-wise XOR operation on any two seeds among the three seeds $SD_X$, $SD_Y$ and $SD_Z$ to generate a bit-wise XOR operation result, and compare the bit-wise XOR operation result with the other seed among the three seeds $SD_X$, $SD_Y$ and $SD_Z$ to generate a first comparison result and compare the bit-wise inverted result of this bit-wise XOR operation result with the other seed among the three seeds $SD_X$, $SD_Y$ and $SD_Z$ to generate a second comparison result, where if the first comparison result indicates that the bit-wise XOR operation result is equal to the other seed or the second comparison result indicates that the bit-wise inverted result of this bit-wise XOR operation result is equal to the other seed, the memory controller 110 reserves the data $DATA_Z$ corresponding to the seed $SD_Z$ for a next round of programming, otherwise, the memory controller 110 is going to find one more seed; and (3) when trying to find one more seed, the memory controller 110 may obtain yet another new seed such as the seed $SD_W$, and perform a bit-wise XOR operation on any two seeds among the four seeds $SD_X$, $SD_Y$, $SD_Z$ and $SD_W$ to generate a bit-wise XOR operation result, and compare the bit-wise XOR operation result with the other seed among the four seeds $SD_X$, $SD_Y$, $SD_Z$ and $SD_W$ to generate a third comparison result and compare the bit-wise inverted result of this bit-wise XOR operation result with the other seed among the four seeds $SD_X$, $SD_Y$, $SD_Z$ and $SD_W$ to generate a fourth comparison result, where if the third comparison result indicates that the bit-wise XOR operation result is equal to the other seed or the fourth comparison result indicates that the bit-wise inverted result of this bit-wise XOR operation result is equal to the other seed, the memory controller 110 may reserve the data $DATA_W$ corresponding to the seed $SD_W$ for a next round of programming, otherwise, the memory controller 110 may trigger the internal copy operation of the NV memory 120 to program the data $\{DATA_X, DATA_Y, DATA_Z, DATA_W\}$ obtained from the source block such as the SLC block 310 into the same hybrid page in the destination block such as the QLC block 320. For brevity, similar descriptions for this embodiment are not repeated in detail here.

Figure 7:
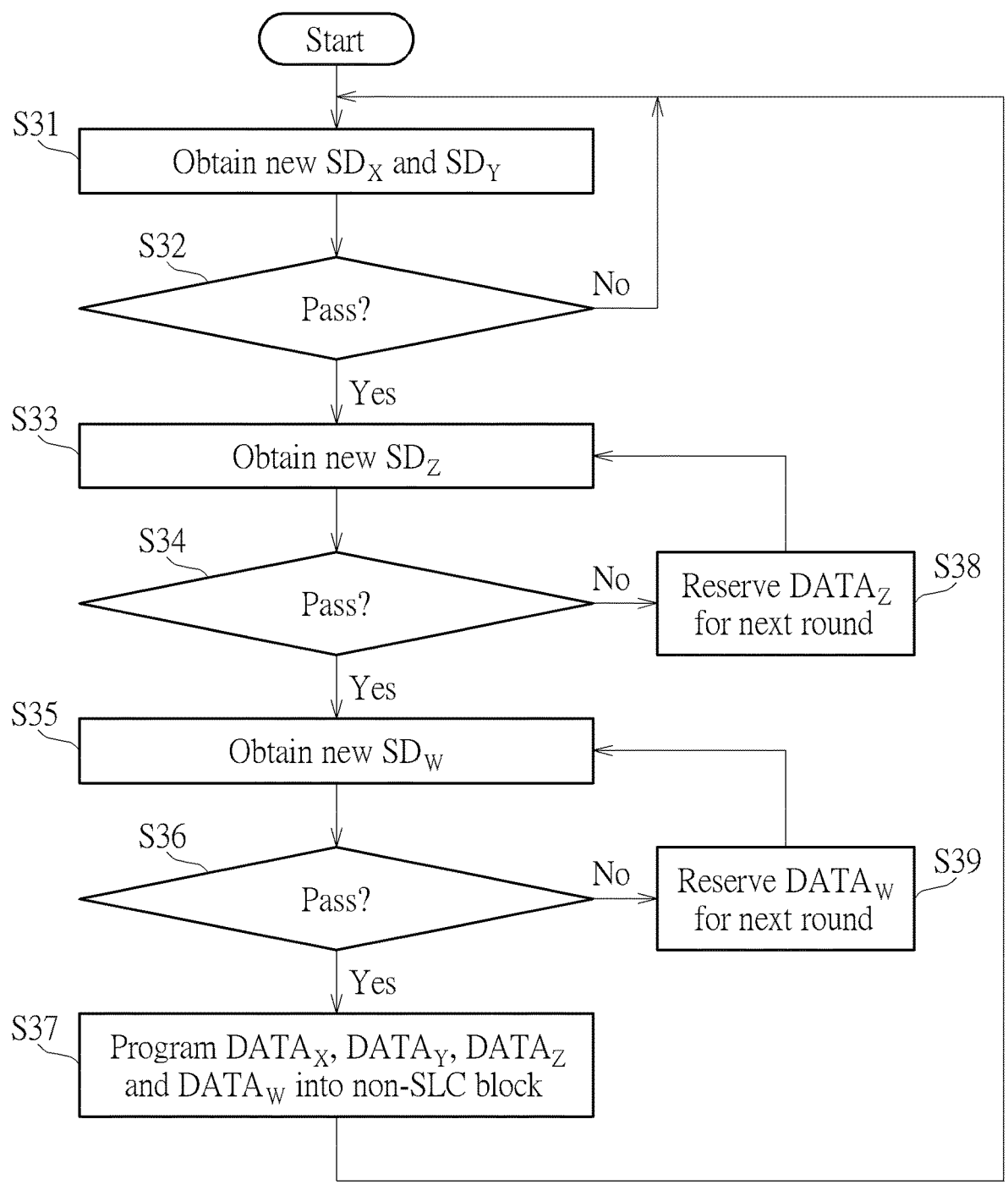
FIG. 7 illustrates a working flow of the method according to an embodiment of the present invention, where some operations of the working flow shown in FIG. 7 can be taken as examples of that in a partial working flow shown in FIG. 6.

FIG. 7 illustrates a working flow of the method according to an embodiment of the present invention, where some operations of the working flow shown in FIG. 7 can be taken as examples of that in a partial working flow shown in FIG. 6.

In Step S31, the memory device 100 (e.g., the memory controller 110) can obtain two new seeds such as the seeds $SD_X$ and $SD_Y$ from the seed table 120S (or the seed table 116S).

In Step S32, the memory device 100 (e.g., the memory controller 110) can check whether it is true that the seeds $SD_X$ and $SD_Y$ are not equal to each other (labeled "Pass" for brevity). If Yes, Step S33 is entered; if No, Step S31 is entered.

In Step S33, the memory device 100 (e.g., the memory controller 110) can obtain another new seed such as the seed $SD_Z$ from the seed table 120S (or the seed table 116S).

In Step S34, the memory device 100 (e.g., the memory controller 110) can check whether it is true that the bit-wise XOR operation result of the any two seeds among the three seeds $SD_X$, $SD_Y$ and $SD_Z$ is not equal to the other seed among the three seeds $SD_X$, $SD_Y$ and $SD_Z$ and that the bit-wise inverted result of the bit-wise XOR operation result of the any two seeds among the three seeds $SD_X$, $SD_Y$ and $SD_Z$ is not equal to the other seed among the three seeds $SD_X$, $SD_Y$ and $SD_Z$ (labeled "Pass" for brevity). If Yes, Step S35 is entered; if No, Step S33 is entered.

In Step S35, the memory device 100 (e.g., the memory controller 110) can obtain yet another new seed such as the seed $SD_W$ from the seed table 120S (or the seed table 116S).

In Step S36, the memory device 100 (e.g., the memory controller 110) can whether it is true that the bit-wise XOR operation result of the any two seeds among the four seeds $SD_X$, $SD_Y$, $SD_Z$ and $SD_W$ is not equal to the other seed among the four seeds $SD_X$, $SD_Y$, $SD_Z$ and $SD_W$ and that the bit-wise inverted result of the bit-wise XOR operation result of the any two seeds among the four seeds $SD_X$, $SD_Y$, $SD_Z$ and $SD_W$ is not equal to the other seed among the four seeds $SD_X$, $SD_Y$, $SD_Z$ and $SD_W$ (labeled "Pass" for brevity). If Yes, Step S37 is entered; if No, Step S35 is entered.

In Step S37, the memory device 100 (e.g., the memory controller 110) can trigger the internal copy operation of the NV memory 120 to program the data {$DATA_X$, $DATA_Y$, $DATA_Z$, $DATA_W$} obtained from the source block such as the SLC block (e.g. the SLC block 310) into the same hybrid page in the destination block such as the non-SLC block (e.g. the QLC block 320).

In Step S38, the memory device 100 (e.g., the memory controller 110) can reserve the data $DATA_Z$ corresponding to the seed $SD_Z$ for a next round of programming.

In Step S39, the memory device 100 (e.g., the memory controller 110) can reserve the data $DATA_W$ corresponding to the seed $SD_Z$ for a next round of programming.

As shown in FIG. 7, the memory device 100 (e.g., the memory controller 110) can perform the operations of at least one partial working flow with respect to the subsequent host commands from the host device 50, to perform data access management of the memory device 100 with aid of randomness-property control in an online manner. For brevity, similar descriptions for this embodiment are not repeated in detail here.

For better comprehension, the method may be illustrated with the working flow shown in FIG. 7, but the present invention is not limited thereto. According to some embodiments, one or more steps may be added, deleted, or changed in the working flow shown in FIG. 7.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing data access management of a memory device with aid of randomness-property control, the method being applied to a memory controller of the memory device, the memory device comprising the memory controller and a non-volatile (NV) memory, the NV memory comprising at least one NV memory element, the method comprising:
receiving a plurality of host commands from a host device and performing data access on the NV memory according to the plurality of host commands, wherein performing the data access on the NV memory according to the plurality of host commands comprises:
in response to at least one host write command among the plurality of host commands, programming data into at least one single level cell (SLC) block to be first stored data corresponding to a data reception stage; and
performing a seed-aware garbage collection (GC) procedure to collect valid data among the first stored data of the at least one SLC block into at least one non-SLC block to be second stored data corresponding to a data storage stage, wherein a bit count per memory cell for a plurality of memory cells within the at least one non-SLC block is greater than one, and the seed-aware GC procedure comprises:
performing a first randomness-property checking operation on a first seed and a second seed to generate a first randomness-property checking result; and
according to the first randomness-property checking result, selectively determining first data of a first page within the at least one SLC block and second data of a second page within the at least one SLC block as a first set of target data for being programmed into the at least one non-SLC block with at least one internal copy operation of the NV memory, wherein the first data is randomized with the first seed before the first data is programmed into the first page in the data reception stage, and the second data is randomized with the second seed before the second data is programmed into the second page in the data reception stage.

2. The method of claim 1, wherein the valid data comprises the first data and the second data; and the seed-aware GC procedure further comprises:
in response to the first data and the second data being determined as the first set of target data, reading the first data from the first page and reading the second data from the second page, for being programmed into the at least one non-SLC block with the at least one internal copy operation of the NV memory.

3. The method of claim 2, wherein the bit count per memory cell for the plurality of memory cells within the at least one non-SLC block is greater than two; and the seed-aware GC procedure further comprises:
performing a second randomness-property checking operation on the first seed and a third seed to generate a second randomness-property checking result;
according to the second randomness-property checking result, selectively determining the first data of the first page within the at least one SLC block and third data of a third page within the at least one SLC block as a second set of target data for being programmed into the at least one non-SLC block with the at least one internal copy operation of the NV memory, wherein the third data is randomized with the third seed before the third data is programmed into the third page in the data reception stage; and
in response to the first data and the third data being determined as the second set of target data, reading the third data from the third page, for being programmed into the at least one non-SLC block with the at least one internal copy operation of the NV memory, wherein the valid data further comprises the third data.

4. The method of claim 2, wherein the bit count per memory cell for the plurality of memory cells within the at least one non-SLC block is greater than two; and the seed-aware GC procedure further comprises:
performing a second randomness-property checking operation on the first seed and a third seed to generate a second randomness-property checking result;
according to the second randomness-property checking result, selectively determining the first data of the first page within the at least one SLC block and third data of a third page within the at least one SLC block as a second set of target data for being programmed into the at least one non-SLC block with the at least one internal copy operation of the NV memory, wherein the third data is randomized with the third seed before the third data is programmed into the third page in the data reception stage; and in response to the first data and the third data being not determined as the second set of target data, reserving the third data for a next round of programming in the data storage stage, wherein the valid data further comprises the third data.

5. The method of claim 4, wherein regarding reserving the third data for the next round of programming in the data storage stage, the third data is reserved for being programmed into the at least one non-SLC block with at least one other internal copy operation of the NV memory.

6. The method of claim 1, wherein the bit count per memory cell for the plurality of memory cells within the at least one non-SLC block is greater than two; and the seed-aware GC procedure further comprises:

performing a second randomness-property checking operation on the first seed and a third seed to generate a second randomness-property checking result; and according to the second randomness-property checking result, selectively determining the first data of the first page within the at least one SLC block and third data of a third page within the at least one SLC block as a second set of target data for being programmed into the at least one non-SLC block with the at least one internal copy operation of the NV memory, wherein the third data is randomized with the third seed before the third data is programmed into the third page in the data reception stage.

7. The method of claim 6, wherein the bit count per memory cell for the plurality of memory cells within the at least one non-SLC block is greater than three; and the seed-aware GC procedure further comprises:

performing an initial checking operation on the first seed and another seed to generate an initial checking result, wherein a time point of performing the initial checking operation is earlier than a time point of performing the first randomness-property checking operation; and according to the initial checking result, selectively determining the first data of the first page within the at least one SLC block and other data of another page within the at least one SLC block as another set of target data for being programmed into the at least one non-SLC block with the at least one internal copy operation of the NV memory, wherein the other data is randomized with said another seed before the other data is programmed into said another page in the data reception stage.

8. The method of claim 7, wherein the initial checking operation comprises one or a combination of a randomness-property checking operation and an equal-value checking operation.

9. The method of claim 6, wherein the first randomness-property checking result indicates a randomness-property of the second seed with respect to the first seed, for indicating a randomness-property of the second data with respect to the first data; and the second randomness-property checking result indicates a randomness-property of the third seed with respect to the first seed, for indicating a randomness-property of the third data with respect to the first data.

10. The method of claim 1, wherein the first randomness-property checking result indicates a randomness-property of the second seed with respect to the first seed, for indicating a randomness-property of the second data with respect to the first data.

11. A memory device, comprising:

a non-volatile (NV) memory, arranged to store information, wherein the NV memory comprises at least one NV memory element; and a memory controller, coupled to the NV memory, arranged to control operations of the memory device, wherein the memory controller comprises:

a processing circuit, arranged to control the memory controller according to a plurality of host commands from a host device, to allow the host device to access the NV memory through the memory controller;

wherein:

the memory controller receives the plurality of host commands from the host device and performs data access on the NV memory according to the plurality of host commands, wherein performing the data access on the NV memory according to the plurality of host commands comprises:

in response to at least one host write command among the plurality of host commands, programming data into at least one single level cell (SLC) block to be first stored data corresponding to a data reception stage; and the memory controller performs a seed-aware garbage collection (GC) procedure to collect valid data among the first stored data of the at least one SLC block into at least one non-SLC block to be second stored data corresponding to a data storage stage, wherein a bit count per memory cell for a plurality of memory cells within the at least one non-SLC block is greater than one, and the seed-aware GC procedure comprises:

performing a first randomness-property checking operation on a first seed and a second seed to generate a first randomness-property checking result; and according to the first randomness-property checking result, selectively determining first data of a first page within the at least one SLC block and second data of a second page within the at least one SLC block as a first set of target data for being programmed into the at least one non-SLC block with at least one internal copy operation of the NV memory, wherein the first data is randomized with the first seed before the first data is programmed into the first page in the data reception stage, and the second data is randomized with the second seed before the second data is programmed into the second page in the data reception stage.

12. An electronic device comprising the memory device of claim 11, and further comprising:

the host device, coupled to the memory device, wherein the host device comprises:

at least one processor, arranged for controlling operations of the host device; and a power supply circuit, coupled to the at least one processor, arranged for providing power to the at least one processor and the memory device;

wherein the memory device provides the host device with storage space.

13. A memory controller of a memory device, the memory device comprising the memory controller and a non-volatile (NV) memory, the NV memory comprising at least one NV memory element, the memory controller comprising:

a processing circuit, arranged to control the memory controller according to a plurality of host commands from a host device, to allow the host device to access the NV memory through the memory controller;
wherein:
the memory controller receives the plurality of host commands from the host device and performs data access on the NV memory according to the plurality of host commands, wherein performing the data access on the NV memory according to the plurality of host commands comprises:
in response to at least one host write command among the plurality of host commands, programming data into at least one single level cell (SLC) block to be first stored data corresponding to a data reception stage; and
the memory controller performs a seed-aware garbage collection (GC) procedure to collect valid data among the first stored data of the at least one SLC block into at least one non-SLC block to be second stored data corresponding to a data storage stage, wherein a bit count per memory cell for a plurality of memory cells within the at least one non-SLC block is greater than one, and the seed-aware GC procedure comprises:
performing a first randomness-property checking operation on a first seed and a second seed to generate a first randomness-property checking result; and
according to the first randomness-property checking result, selectively determining first data of a first page within the at least one SLC block and second data of a second page within the at least one SLC block as a first set of target data for being programmed into the at least one non-SLC block with at least one internal copy operation of the NV memory, wherein the first data is randomized with the first seed before the first data is programmed into the first page in the data reception stage, and the second data is randomized with the second seed before the second data is programmed into the second page in the data reception stage.

* * * * *